15

United States Patent
Yi et al.

(10) Patent No.: US 8,982,553 B2
(45) Date of Patent: Mar. 17, 2015

(54) MOBILE TERMINAL AND METHOD FOR FABRICATING CASE THEREOF

(75) Inventors: Jonghyuk Yi, Gyeonggi-Do (KR); Sukho Hong, Seoul (KR); Seongyoung Seo, Gyeonggi-Do (KR); Wonkee Ahn, Gyeonggi-Do (KR); Mingi Jung, Gyeonggi-Do (KR); Minsoo Kim, Seoul (KR); Taekyoon Bae, Seoul (KR)

(73) Assignee: LG Electronics Inc., Seoul (KR)

( * ) Notice: Subject to any disclaimer, the term of this patent is extended or adjusted under 35 U.S.C. 154(b) by 317 days.

(21) Appl. No.: 13/448,249

(22) Filed: Apr. 16, 2012

(65) Prior Publication Data
US 2013/0063874 A1    Mar. 14, 2013

(30) Foreign Application Priority Data
Sep. 8, 2011 (KR) .................. 10-2011-0091447

(51) Int. Cl.
G06F 1/16 (2006.01)
H04M 1/02 (2006.01)
H05K 5/02 (2006.01)

(52) U.S. Cl.
CPC ........... *H04M 1/0283* (2013.01); *H05K 5/0243* (2013.01); *G06F 1/1656* (2013.01)
USPC .................. 361/679.55; 455/575.8; 24/593.1

(58) Field of Classification Search
USPC ............... 455/575.8; 24/593.1; 361/679.55
See application file for complete search history.

(56) References Cited

U.S. PATENT DOCUMENTS

| 3,921,312 | A * | 11/1975 | Fuller ................................ 434/96 |
| 7,731,191 | B2 * | 6/2010 | Sternberg ................... 273/148 B |
| 8,028,794 | B1 * | 10/2011 | Freeman ....................... 181/202 |
| 8,245,842 | B2 * | 8/2012 | Bau .............................. 206/320 |
| 8,359,078 | B2 * | 1/2013 | Hung ......................... 455/575.8 |
| 8,369,907 | B2 * | 2/2013 | Lim et al. ................... 455/575.1 |
| 8,477,931 | B2 * | 7/2013 | Thompson et al. ........... 379/451 |
| 8,567,149 | B2 * | 10/2013 | Kuzmin ....................... 52/592.1 |
| 8,624,111 | B2 * | 1/2014 | Tages et al. ..................... 174/50 |
| 8,655,422 | B2 * | 2/2014 | Stiehl et al. ............... 455/575.8 |
| 2002/0137474 | A1 * | 9/2002 | Wu ................................ 455/90 |
| 2005/0022924 | A1 * | 2/2005 | Blackburn .................... 156/230 |
| 2005/0130721 | A1 * | 6/2005 | Gartrell ..................... 455/575.8 |
| 2006/0188668 | A1 * | 8/2006 | Wahba ........................... 428/13 |

(Continued)

FOREIGN PATENT DOCUMENTS

WO          92/04701         3/1992
WO        2007/110751       10/2007

(Continued)

OTHER PUBLICATIONS

European Patent Office Application Serial No. 12164918.0, Search Report dated Mar. 20, 2013, 11 pages.
European Patent Office Application Serial No. 12164918.0, Search Report dated Dec. 21, 2012, 6 pages.

*Primary Examiner* — Lisa Lea Edmonds
(74) *Attorney, Agent, or Firm* — Lee, Hong, Degerman, Kang & Waimey (57) ABSTRACT

In a mobile terminal having a case defining an appearance of the terminal, and a fabrication method for the case, the mobile terminal includes a plurality of pieces formed of zirconia or ceramic and each having a preset shape, and a frame recessed into one surface of the case to receive the plurality of pieces, the frame covering edges of the plurality of pieces, wherein the plurality of pieces are aligned in a repetitive manner to define one surface of the case.

20 Claims, 8 Drawing Sheets

(56) References Cited

U.S. PATENT DOCUMENTS

| | | | |
|---|---|---|---|
| 2010/0240427 A1* | 9/2010 | Lee | 455/575.8 |
| 2010/0302716 A1* | 12/2010 | Gandhi | 361/679.01 |
| 2010/0311300 A1* | 12/2010 | Hansen et al. | 446/91 |
| 2010/0331167 A1* | 12/2010 | Ohta et al. | 501/96.1 |
| 2012/0201685 A1* | 8/2012 | Merrill et al. | 416/220 R |

FOREIGN PATENT DOCUMENTS

| | | |
|---|---|---|
| WO | 2008/113808 | 9/2008 |
| WO | 2011/015976 | 2/2011 |

* cited by examiner

MOBILE TERMINAL AND METHOD FOR FABRICATING CASE THEREOF

CROSS-REFERENCE TO RELATED APPLICATION

Pursuant to 35 U.S.C. §119(a), this application claims the benefit of earlier filing date and right of priority to Korean Application No. 10-2011-0091447, filed on Sep. 8, 2011, the contents of which is incorporated by reference herein in its entirety.

BACKGROUND OF THE INVENTION

1. Field of the Invention

This specification relates to a mobile terminal having a case, and a method for fabricating a case thereof.

2. Background of the Invention

Mobile terminals are electronic devices which are portable and have at least one of voice and telephone call functions, information input and/or output functions, a data storage function and the like.

As it becomes multifunctional, the mobile terminal can be allowed to capture still images or moving images, play music or video files, play games, receive broadcast and the like, so as to be implemented as an integrated multimedia player.

Various attempts have been done for the multimedia device in aspect of hardware or software in order to implement such complicated functions.

Many users have their mobile terminals to express their own personalities, and accordingly, various designs are required for the mobile terminal. The various designs include structural change (variation, modification) and improvement of outer appearance of the mobile terminal.

The mobile terminal includes a case configuring its appearance. The case may not only simply protect the mobile terminal from external environments but also provide an aesthetic function. As an example of the structural change and improvement, a mobile terminal whose case has various patterns can be considered.

SUMMARY OF THE INVENTION

Therefore, an aspect of the detailed description is to provide a mobile terminal having various patterns on a case thereof, and a method for fabricating a case thereof.

To achieve these and other advantages and in accordance with the purpose of this specification, as embodied and broadly described herein, there is provided a mobile terminal including a case defining an appearance of the terminal, wherein the case includes a plurality of pieces formed of zirconia or ceramic and each having a preset shape, and a frame recessed into one surface of the case to receive the plurality of pieces, the frame covering edges of the plurality of pieces, wherein the plurality of pieces are aligned in a repetitive manner to define one surface of the case.

In accordance with an exemplary embodiment, each of the plurality of pieces may include an exposed portion exposed to the exterior, and an overlapped portion overlapped by the exposed portion of an adjacent piece. The exposed portion and the overlapped portion may be stepped with each other. The exposed portion formed at one of the plurality of pieces may be flush with the exposed portion formed at another one of the plurality of pieces.

In accordance with another exemplary embodiment, each of the plurality of pieces may include a body having an upper surface and a lower surface, a first extending portion extending from the upper surface to be externally exposed together with the upper surface, and a second extending portion extending from the lower surface to be overlapped by the first extending portion of an adjacent piece. A coupling layer may be located between the first extending portion of one of the plurality of pieces and the second extending portion of another one piece overlapped by the first extending portion, and the coupling layer may be formed by sintering the plurality of pieces to couple the first extending portion to the second extending portion.

In accordance with an exemplary embodiment, each of the plurality of pieces may include a base having at least one surface externally exposed and provided with a receiving groove, and a protrusion protruding from the base to be inserted into the receiving groove of an adjacent piece and overlapped by the adjacent piece. The receiving groove may be provided with a stopping recess to restrict separation of the protrusion. Also, the mobile terminal may further include a finishing member coupled to each piece located at an edge. The finishing member may include a stopping hook, and the frame may include a stopping recess coupled with the stopping hook to fix the finishing member coupled to the plurality of pieces onto the frame.

In accordance with an exemplary embodiment, guide slits may be formed at a bottom surface of each of the plurality of pieces, and the frame may include guide ribs inserted into the guide slits to allow the plurality of pieces to be mounted at preset positions, respectively. The guide slits of each of the plurality of pieces may include a first slit extending in a first direction, and a second slit extending in a second direction intersecting with the first direction.

In accordance with an exemplary embodiment, the mobile terminal may further include a cover layer to cover the plurality of pieces.

In accordance with an exemplary embodiment, the mobile terminal may further include a base formed of synthetic resin to obscure lower portions of the plurality of pieces, and mounted onto the frame. The plurality of pieces may be coupled onto the base through an insert-injection. The frame may include through holes, and the base may include poles protruding from one surface thereof to be inserted into the through holes. An end of each pole exposed through the through hole may be welded to form a welded portion.

In accordance with an exemplary embodiment, the mobile terminal may further include adhesive sheets disposed between the plurality of pieces and the frame, and a base formed of synthetic resin to cover lower portions of the plurality of pieces and the frame through an insert-injection.

The adhesive sheet may be formed to have an adhesive property over a preset temperature. The adhesive sheets may allow the plurality of pieces to be coupled onto the frame by heat generated upon the insert-injection.

To achieve these and other advantages and in accordance with the purpose of this specification, as embodied and broadly described herein, there is provided a method for fabricating a case of a mobile terminal, the case defining an appearance of the mobile terminal. The method may include fabricating a plurality of pieces formed of zirconia or ceramic through an injection molding or a compression molding, repetitively aligning the plurality of pieces in a manner of inserting a protrusion of one of the pieces into a receiving groove of another piece, coupling a finishing member to each piece located at an edge so as to finish the edge, and coupling the plurality of pieces and the finishing member onto a frame.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of a mobile terminal and a method for fabricating a case thereof in accordance with the exemplary embodiments, with reference to the accompanying drawings.

For the sake of brief description with reference to the drawings, the same or equivalent components will be provided with the same reference numbers, and description thereof will not be repeated. The expression in the singular form in this specification will cover the expression in the plural form unless otherwise indicated obviously from the context.

Hereinafter, suffixes "module" and "unit or portion" for components used herein in description are merely provided only for facilitation of preparing this specification, and thus they are not granted a specific meaning or function.

Mobile terminals described in the present invention may include smart phones, laptop computers, digital broadcasting terminals, personal digital assistants (PDAs), portable multimedia players (PMPs), E-books, navigators, and the like.

Figure 1:
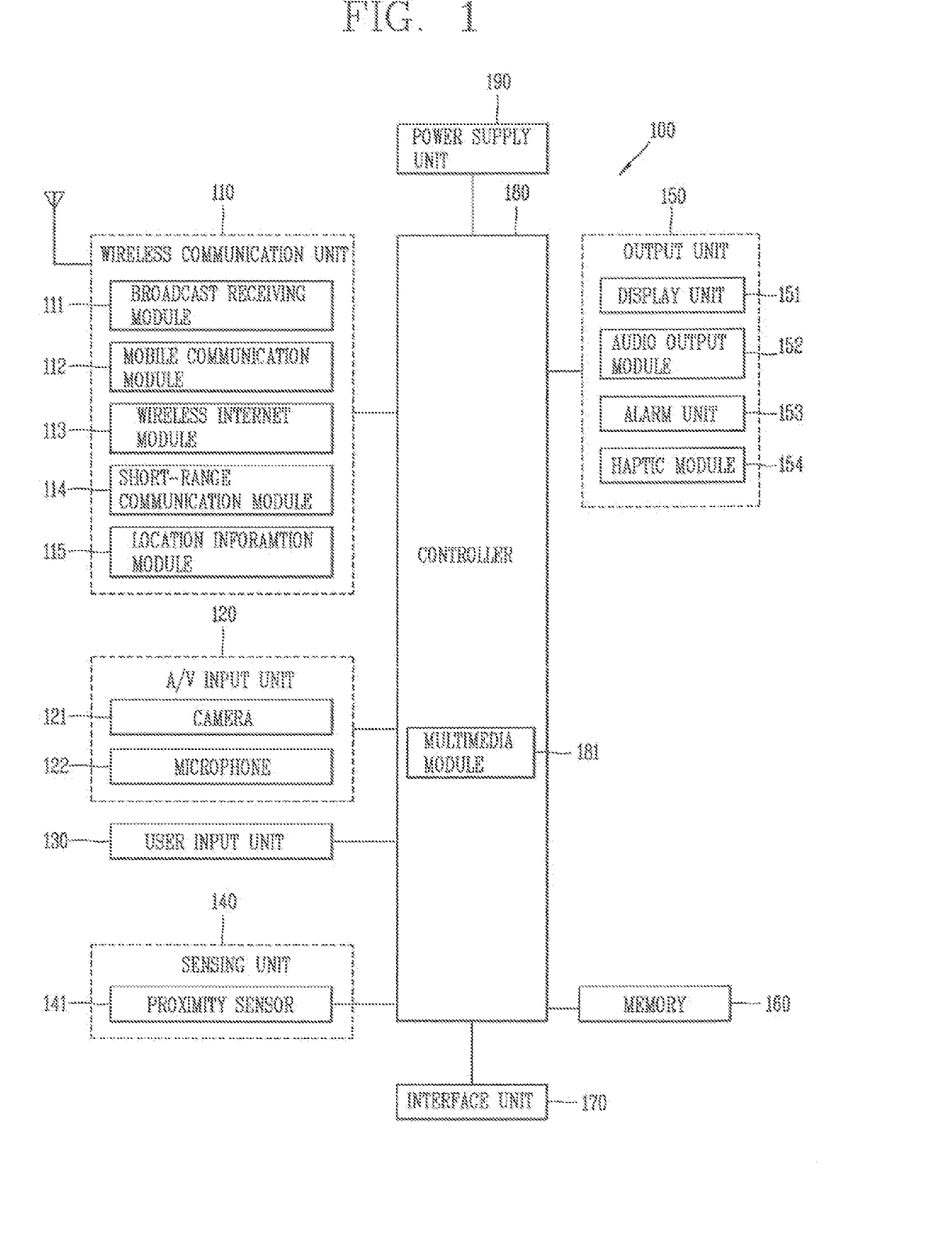
FIG. 1 is a block diagram of a mobile terminal in accordance with one exemplary embodiment.

FIG. 1 is a block diagram of a mobile terminal 100 in accordance with one exemplary embodiment.

The mobile terminal 100 may comprise components, such as a wireless communication unit 110, an Audio/Video (A/V) input unit 120, a user input unit 130, a sensing unit 140, an output unit 150, a memory 160, an interface unit 170, a controller 180, a power supply 190 and the like. FIG. 1 shows the mobile terminal 100 having various components, but it is understood that implementing all of the illustrated components is not a requirement. Greater or fewer components may alternatively be implemented.

Hereinafter, each component is described in sequence.

The wireless communication unit 110 may typically include one or more modules which permit wireless communications between the mobile terminal 100 and a wireless communication system or between the mobile terminal 100 and a network within which the mobile terminal 100 is located. For example, the wireless communication unit 110 may include a broadcast receiving module 111, a mobile communication module 112, a wireless Internet module 113, a short-range communication module 114, a location information module 115 and the like.

The broadcast receiving module 111 receives a broadcast signal and/or broadcast associated information from an external broadcast managing entity via a broadcast channel.

The broadcast channel may include a satellite channel and a terrestrial channel. The broadcast managing entity may indicate a server which generates and transmits a broadcast signal and/or broadcast associated information or a server which receives a pre-generated broadcast signal and/or broadcast associated information and sends them to the mobile terminal. The broadcast signal may be implemented as a TV broadcast signal, a radio broadcast signal, and a data broadcast signal, among others. The broadcast signal may further include a data broadcast signal combined with a TV or radio broadcast signal.

Examples of broadcast associated information may include information associated with a broadcast channel, a broadcast program, a broadcast service provider, and the like. The broadcast associated information may be provided via a mobile communication network, and received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module 111 may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) and the like. The broadcast receiving module 111 may be configured to be suitable for every broadcast system transmitting broadcast signals as well as the digital broadcasting systems.

Broadcast signals and/or broadcast associated information received via the broadcast receiving module 111 may be stored in a suitable device, such as a memory 160.

The mobile communication module 112 transmits/receives wireless signals to/from at least one of network entities (e.g., base station, an external mobile terminal, a server, etc.) on a mobile communication network. Here, the wireless signals may include audio call signal, video (telephony) call signal, or various formats of data according to transmission/reception of text/multimedia messages.

The wireless Internet module 113 supports wireless Internet access for the mobile terminal. This module may be internally or externally coupled to the mobile terminal 100. Examples of such wireless Internet access may include Wireless LAN (WLAN) (Wi-Fi), Wireless Broadband (Wibro), Worldwide Interoperability for Microwave Access (Wimax), High Speed Downlink Packet Access (HSDPA) and the like.

The short-range communication module 114 denotes a module for short-range communications. Suitable technologies for implementing this module may include BLUETOOTH™, Radio Frequency IDentification (RFID), Infrared Data Association (IrDA), Ultra-WideBand (UWB), ZigBee™, and the like.

The location information module 115 denotes a module for detecting or calculating a position of a mobile terminal. An example of the location information module 115 may include a Global Position System (GPS) module.

Referring to FIG. 1, the A/V input unit 120 is configured to provide audio or video signal input to the mobile terminal. The A/V input unit 120 may include a camera 121 and a microphone 122. The camera 121 receives and processes image frames of still pictures or video obtained by image sensors in a video call mode or a capturing mode. The processed image frames may be displayed on a display unit 151.

The image frames processed by the camera 121 may be stored in the memory 160 or transmitted to the exterior via the wireless communication unit 110. Two or more cameras 121 may be provided according to the configuration of the mobile terminal.

The microphone 122 may receive an external audio signal while the mobile terminal is in a particular mode, such as a phone call mode, a recording mode, a voice recognition mode, or the like. This audio signal is processed into digital data. The processed digital data is converted for output into a format transmittable to a mobile communication base station via the mobile communication module 112 in case of the phone call mode. The microphone 122 may include assorted noise removing algorithms to remove noise generated in the course of receiving the external audio signal.

The user input unit 130 may generate input data input by a user to control the operation of the mobile terminal. The user input unit 130 may include a keypad, a dome switch, a touchpad (e.g., static pressure/capacitance), a jog wheel, a jog switch and the like.

The sensing unit 140 provides status measurements of various aspects of the mobile terminal. For instance, the sensing unit 140 may detect an open/close status of the mobile terminal, a change in a location of the mobile terminal 100, a presence or absence of user contact with the mobile terminal 100, the location of the mobile terminal 100, acceleration/deceleration of the mobile terminal 100, and the like, so as to generate a sensing signal for controlling the operation of the mobile terminal 100. For example, regarding a slide-type mobile terminal, the sensing unit 140 may sense whether a sliding portion of the mobile terminal is open or closed. Other examples include sensing functions, such as the sensing unit 140 sensing the presence or absence of power provided by the power supply 190, the presence or absence of a coupling or other connection between the interface unit 170 and an external device. Meanwhile, the sensing unit 140 may include a proximity sensor 141.

The output unit 150 is configured to output an audio signal, a video signal or a tactile signal. The output unit 150 may include a display unit 151, an audio output module 152, an alarm unit 153 and a haptic module 154.

The display unit 151 may output information processed in the mobile terminal 100. For example, when the mobile terminal is operating in a phone call mode, the display unit 151 will provide a User Interface (UI) or a Graphic User Interface (GUI), which includes information associated with the call. As another example, if the mobile terminal is in a video call mode or a capturing mode, the display unit 151 may additionally or alternatively display images captured and/or received, UI, or GUI.

The display unit 151 may be implemented using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display, or the like.

Some of such displays 151 may be implemented as a transparent type or an optical transparent type through which the exterior is visible, which is referred to as 'transparent display'. A representative example of the transparent display may include a Transparent OLED (TOLED), and the like. The rear surface of the display unit 151 may also be implemented to be optically transparent. Under this configuration, a user can view an object positioned at a rear side of a terminal body through a region occupied by the display unit 151 of the terminal body.

The display unit 151 may be implemented in two or more in number according to a configured aspect of the mobile terminal 100. For instance, a plurality of the displays 151 may be arranged on one surface to be spaced apart from or integrated with each other, or may be arranged on different surfaces.

Here, if the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touch pad, and the like.

The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also a touch pressure.

When touch inputs are sensed by the touch sensors, corresponding signals are transmitted to a touch controller (not shown). The touch controller processes the received signals, and then transmits corresponding data to the controller 180. Accordingly, the controller 180 may sense which region of the display unit 151 has been touched.

Still referring to FIG. 1, a proximity sensor 141 may be arranged at an inner region of the mobile terminal 100 covered by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may output audio data received from the wireless communication unit 110 or stored in the memory 160, in a call-receiving mode, a call-placing mode, a recording mode, a voice recognition mode, a broadcast reception mode, and so on. The audio output module 152 may output audio signals relating to functions performed in the mobile terminal 100, e.g., sound alarming a call received or a message received, and so on. The audio output module 152 may include a receiver, a speaker, a buzzer, and so on.

The alarm unit 153 outputs signals notifying occurrence of events from the mobile terminal 100. The events occurring from the mobile terminal 100 may include call received, message received, key signal input, touch input, and so on. The alarm unit 153 may output not only video or audio signals, but also other types of signals such as signals notifying occurrence of events in a vibration manner. Since the video or audio signals can be output through the display unit 151 or the audio output module 152, the display unit 151 and the audio output module 152 may be categorized into a part of the alarm unit 153.

The haptic module 154 generates various tactile effects which a user can feel. A representative example of the tactile effects generated by the haptic module 154 includes vibration. Vibration generated by the haptic module 154 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 160 may store a program for the processing and control of the controller 180. Alternatively, the memory 160 may temporarily store input/output data (e.g., phonebook data, messages, still images, video and the like). Also, the memory 160 may store data related to various patterns of vibrations and audio output upon the touch input on the touch screen.

The memory 160 may be implemented using any type of suitable storage medium including a flash memory type, a hard disk type, a memory card type (e.g., SD or DX memory), Random Access Memory (RAM), Static Random Access Memory (SRAM), Read-Only Memory (ROM), Electrically Erasable Programmable Read-Only Memory (EEPROM), Programmable Read-Only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), and the like. Also, the device having the identification module (hereinafter, referred to as 'identification device') may be implemented in a type of smart card. Hence, the identification device can be coupled to the mobile terminal 100 via a port.

Also, the interface unit 170 may serve as a path for power to be supplied from an external cradle to the mobile terminal 100 when the mobile terminal 100 is connected to the external cradle or as a path for transferring various command signals input from the cradle by a user to the mobile terminal 100. Such various command signals or power input from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component.

The controller 180 can perform a pattern recognition processing so as to recognize writing or drawing input on the touch screen as text or image.

The power supply 190 provides power required by various components under the control of the controller 180. The provided power may be internal power, external power, or combination thereof.

Various embodiments described herein may be implemented in a computer-readable medium using, for example, software, hardware, or some combination thereof.

For a hardware implementation, the embodiments described herein may be implemented within one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, microprocessors, other electronic units designed to perform the functions described herein, or a selective combination thereof. In some cases, such embodiments are implemented by the controller 180.

For software implementation, the embodiments such as procedures and functions may be implemented together with separate software modules each of which performs at least one of functions and operations. The software codes can be implemented with a software application written in any suitable programming language. Also, the software codes may be stored in the memory 160 and executed by the controller 180.

Figure 2:
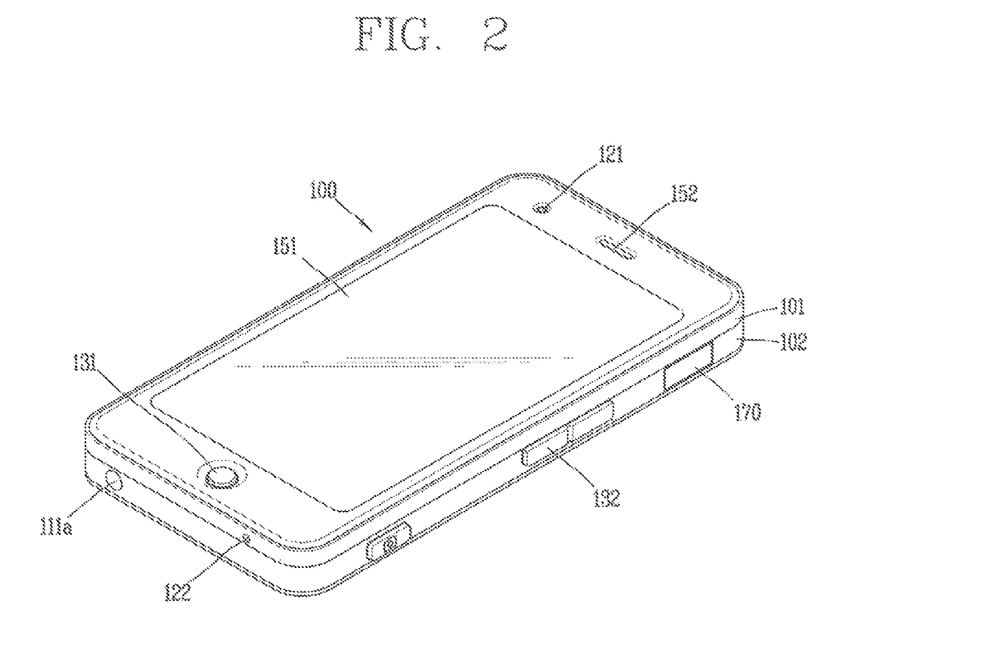
FIG. 2 is a front perspective view of the mobile terminal.

FIG. 2 is a front perspective view of the mobile terminal 100.

The mobile terminal 100 shown in FIG. 2 is a bar type mobile terminal. However, this detailed description may be applicable, but not limited to, a various structures, such as a slide type, a folder type, a swing type, a swivel type and the like, having two or more bodies coupled to be relatively movable with each other.

A body may include a case (or referred to as casing, housing, cover, etc.) defining an appearance of the mobile terminal 100. In this exemplary embodiment, the case may be divided into a front case 101 and a rear case 102. A space formed between the front and rear cases 101 and 102 may accommodate various electronic components. At least one intermediate case may further be disposed between the front and the rear cases 101 and 102.

Such cases may be injected using a synthetic resin or be formed of a metal, such as stainless steel (STS), titanium (Ti) or the like.

The terminal body is shown having a display unit 151, an audio output module 152, a camera 121, a user input unit 130/131, 132, a microphone 122, an interface unit 170, and the like.

The display unit 151 may occupy most of a main surface of the front case 101. The audio output module 152 and the camera 121 may be disposed near one of both end portions of the display unit 151, and the user input unit 131 and the microphone 122 on the other end portion of the display unit 151. The user input unit 132, the interface unit 170 and the like may be disposed on side surfaces of the front and rear cases 101 and 102.

The user input unit 130 may be manipulated to allow inputting of commands for controlling operations of the mobile terminal 100, and include a plurality of first manipulation units 131, 132. The plurality of manipulation units 131, 132 may be referred to as a manipulating portion. Such manipulating portion can employ any tactile manner that a user can touch or tap for manipulation.

The first and second manipulation units 131, 132 may be set to allow inputting of various contents. For example, the first manipulation unit 131 may be configured to input commands such as START, END, SCROLL or the like, and the second manipulation unit 132 may be configured to input commands, such as a volume adjustment of sounds output from the audio output module 152, conversion of the display unit 151 into a touch recognition mode, or the like.

Figure 3:
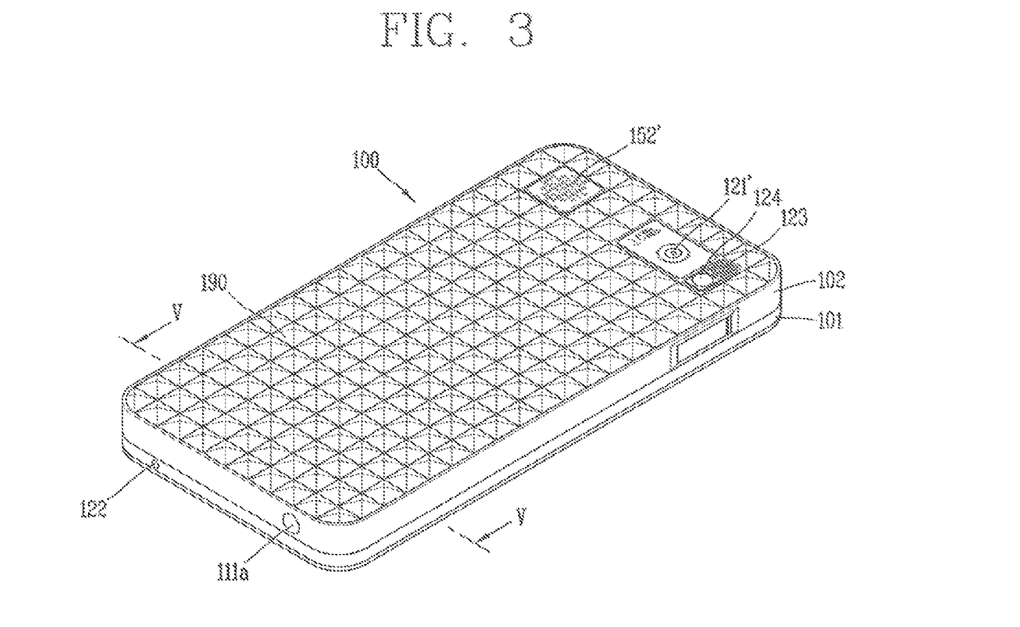
FIG. 3 is a rear perspective view of the mobile terminal shown in FIG. 2.

FIG. 3 is a rear perspective view of the mobile terminal 100 shown in FIG. 2.

As shown in FIG. 3, a rear face of the terminal body, namely, the rear case 102 may further be provided with a camera 121'. The camera 121' faces a direction which is opposite to a direction faced by the camera 121, and may have different pixels from those of the camera 121.

For example, the camera 121 may operate with relatively lower pixels (lower resolution). Thus, the camera 121 may be useful when a user can capture his face and send it to another party during a video call or the like. On the other hand, the camera 121' may operate with a relatively higher pixels (higher resolution) such that it can be useful for a user to obtain higher quality pictures for later use.

A flash 123 and a mirror 124 may additionally be disposed adjacent to the camera 121'. The flash 123 operates in conjunction with the camera 121' when taking a picture using the camera 121'. The mirror 124 can cooperate with the camera 121' to allow a user to photograph himself in a self-portrait mode.

An audio output module 152' may further be disposed at a rear face of the terminal body. The audio output module 152' can cooperate with the audio output module 152 (see FIG. 2) to provide stereo output. Also, the audio output module 152' may be configured to operate as a speakerphone.

A broadcast signal receiving antenna 124 may further be disposed at one side of the terminal body in addition to an antenna for communications, for example. The antenna 124 configuring a part of the broadcast receiving module 111 (see FIG. 1) may be retractable into the terminal body.

A power supply unit 190 for supplying power to the mobile terminal 100 may be mounted in the terminal body. The power supply unit 190 may be mounted in the terminal body or detachably coupled directly onto the outside of the terminal body.

The case (for example, the front case 101, the rear case 102, the battery cover, etc.) defining the appearance of the terminal body may accommodate various kinds of electronic components, and have an aesthetic function as well as a simple function of protecting the mobile terminal from environments. Hereinafter, description will be given in more detail of the mobile terminal 100 having a case with various patterns and a method for fabricating the case.

Figure 4:
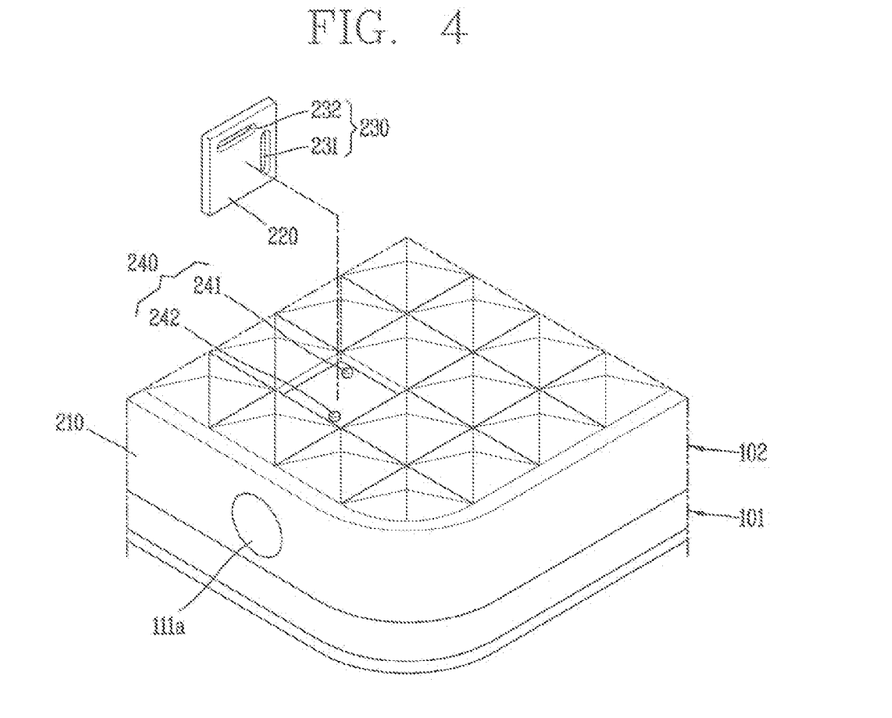
FIG. 4 is an overview showing one exemplary rear case of FIG. 3.
Figure 5:
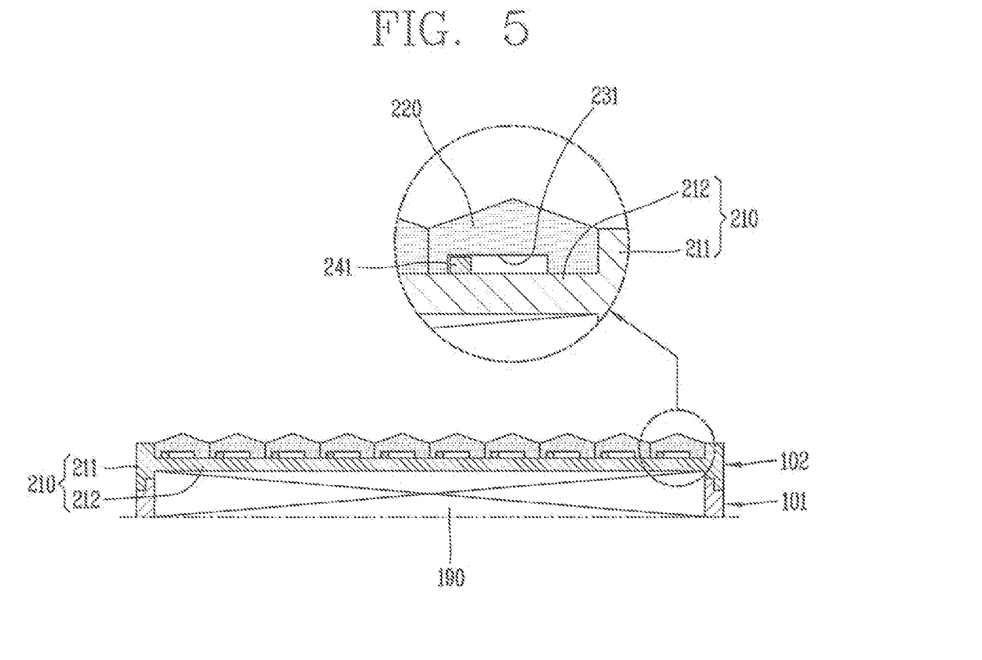
FIG. 5 is a sectional view taken along the line V-V of FIG. 3.

FIG. 4 is an overview showing one example of the rear case 102 of FIG. 3, and FIG. 5 is a sectional view taken along the line V-V of FIG. 3.

As shown in FIGS. 4 and 5, the rear case 102 may include a frame 210, and a plurality of pieces 220 accommodated within the frame 210.

The frame 210 may define a shape of the rear case 102, and be coupled to the front case 101. The frame 210 may be formed by injecting synthetic resin or formed of a metal (for example, stainless glass (STS), aluminum (Al), titanium (Ti, etc.).

The frame 210 may include an edge part 211 and a supporting part 212. The edge part 211 may extend along edges of the terminal body, and be coupled to edges of the front case 101. The supporting part 212 may extend from the edge part 211 toward the inside of the frame 210 so as to support the plurality of pieces 220 accommodated in the frame 210. The supporting part 212 may be disposed to cover the power supply unit 190 mounted in the terminal body.

The plurality of pieces 220 may be received on the supporting part 212 recessed into one surface of the frame 210. The plurality of pieces 220 may be formed of zirconia or ceramic. Especially, the zirconia is highly aesthetic and has high intensity and an effect of cutting off heat, accordingly, it has an advantage in the aspects of enhancement of appearance of the mobile terminal 100, prevention of scratches, and blocking of heat generated from the inside.

The plurality of pieces 220 may have a preset shape. The drawings show that each piece 220 is in form of a plate with an externally exposed portion in form of a pyramid. The plurality of pieces 220 may be formed by Ceramic Injection Molding (CIM), a compression molding and the like. The injection molding may be advantageous in view of implementing a complicated shape, and the compression molding may be advantageous in view of simplifying processes, implementing properties and requiring for a less fabricating cost.

As shown in FIG. 3, the plurality of pieces 220 may be repetitively disposed to define one surface of the rear case 102. The plurality of pieces 220 may be disposed to cover an entire rear surface of the terminal body excluding the camera 121', the audio output module 152' and the like. The plurality of pieces 220 may be received on the supporting part 212, and firmly coupled onto the frame 210 by an adhesive and/or a coupling structure (for example, a hook structure).

Alternatively, a mold corresponding to the frame 210 is fabricated and the plurality of pieces 220 are inserted and molded, thereby coupling the plurality of pieces 220 to the frame 210. Here, upon fabricating the mold, measurements of the mold should be designed to match the measurements of the plurality of pieces 220 and shrinkage of a molding material, and also the frame 210 can be formed such that the plurality of pieces 220 can be secured by the shape of the frame 210.

Guide units for guiding mounting positions of the plurality of pieces 220 may be formed at the frame 210 and the plurality of pieces 220 such that the plurality of pieces 220 can be mounted at preset positions on the frame 210. For example, as shown in FIGS. 4 and 5, a guide slit 230 (231, 232) may be formed at a bottom surface of each piece 220, and a guide rib 240 (241, 242) inserted into the guide slit 230 may be formed at the supporting part 212 such that the plurality of pieces 220 can be mounted on preset positions.

The guide slit 230 (231, 232) may be provided by two at each of the plurality of pieces 220. The guide slits 230 (231, 232) may extend in different directions such that the corresponding piece 220 can be fixed at an accurate position. In detail, each piece 220 may include a first groove 231 extending in a first direction (for example, X-axial direction), and a second groove 232 extending in a second direction (for example, Y-axial direction) intersecting with the first direction. With the structure, a position of the piece 220 in the Y-axial direction is fixed by the first groove 231, and a position of the piece 220 in the X-axial direction is fixed b the second groove 232, thereby fixing the piece 220 at a more accurate position.

Figure 6:
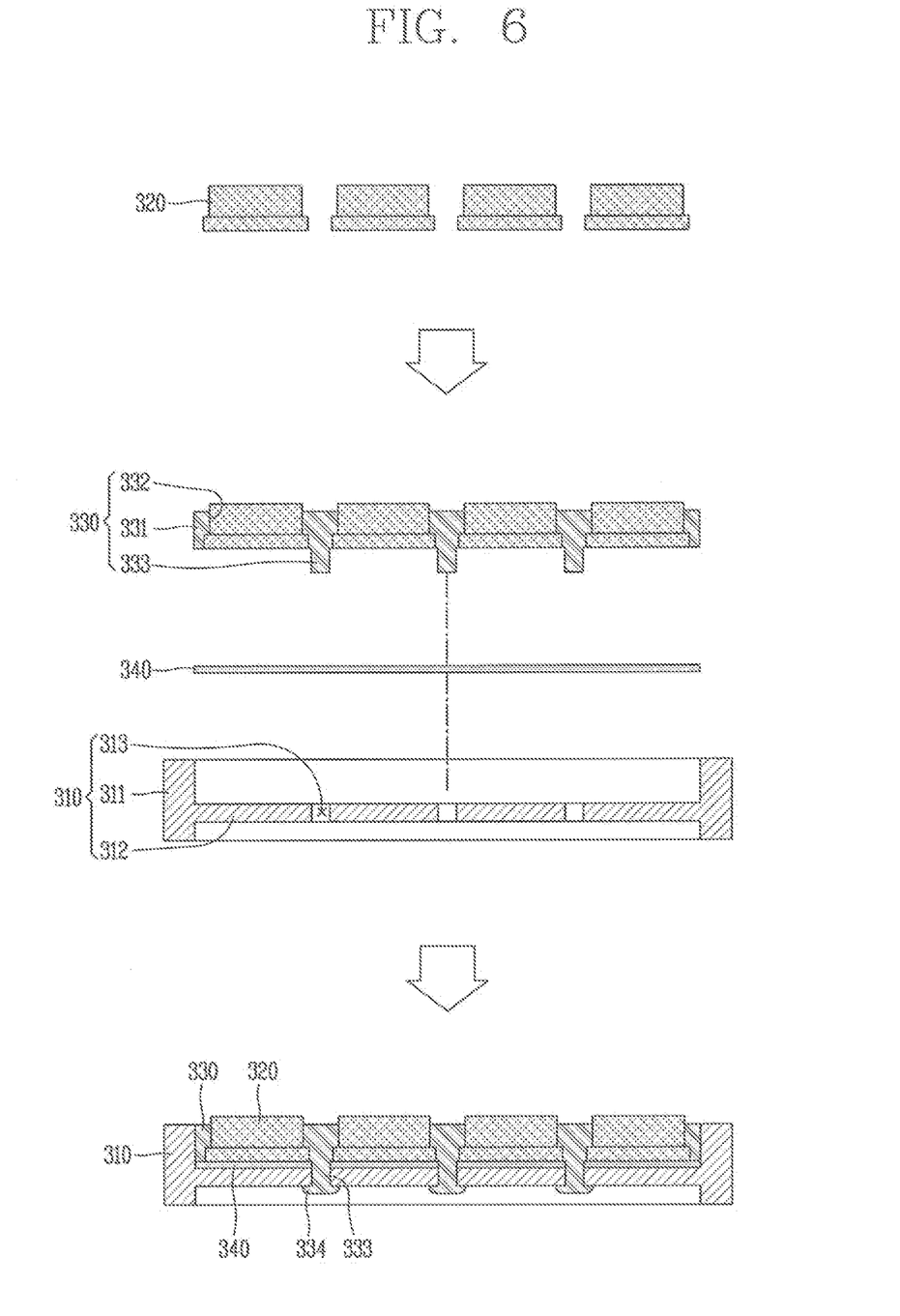
FIGS. 6 and 7 are overviews showing a variation of the rear case structure of FIG. 3 and its fabrication method.
Figure 7:
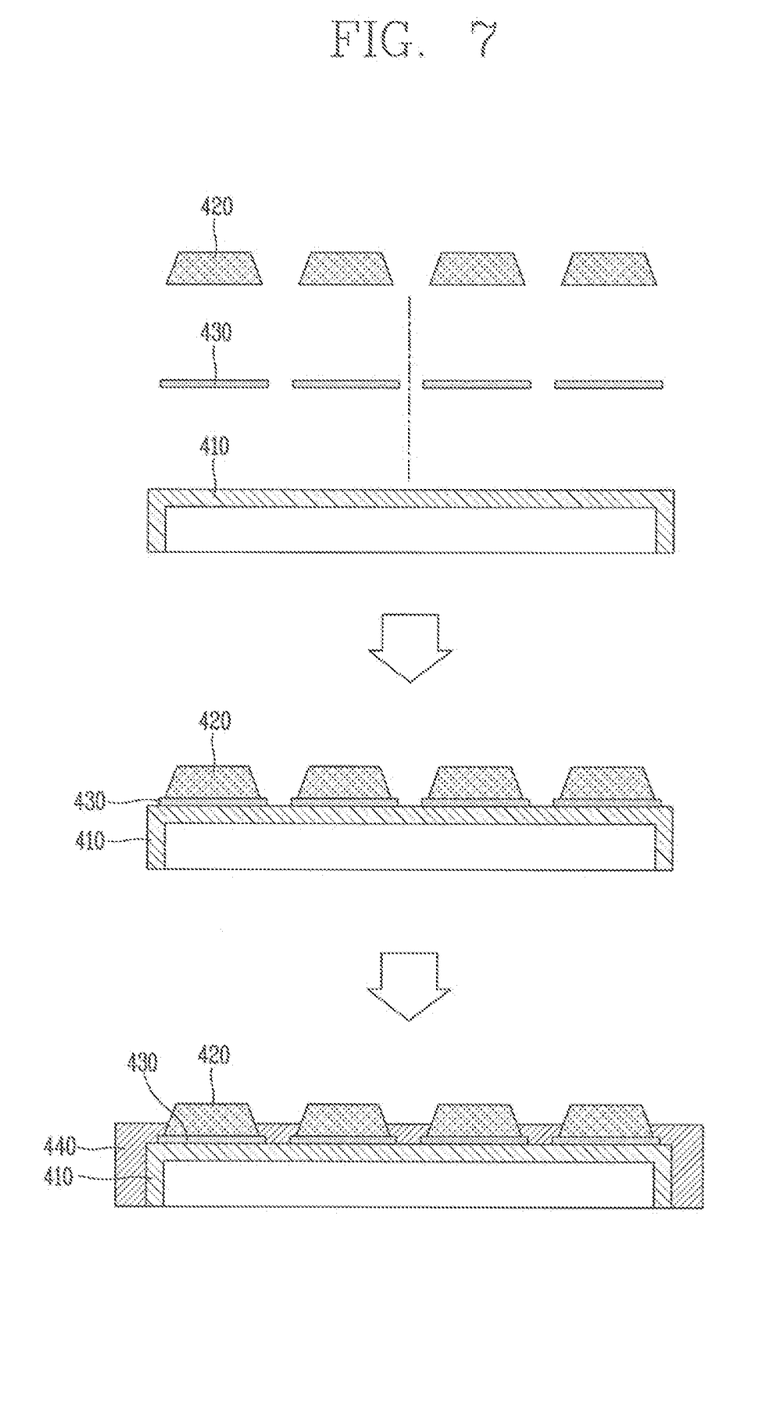

FIGS. 6 and 7 are overviews showing a variation of the structure of the rear case 102 shown in FIG. 3, and a fabrication method thereof.

As shown in FIG. 6, the rear case 102 may be shown further having a base 330 for connecting a plurality of pieces 320 to a frame 310. The base 330 may obscure lower portions of the plurality of pieces 320, respectively, to expose only upper portions thereof to the exterior. The base 330 may be formed of synthetic resin. The base 330 may be provided with a body 331, and a plurality of through holes 332 formed through the body 331. The plurality of pieces 320 may be inserted into the through holes 332, respectively, or be integrally coupled to the base 330 by an insert-injection.

The base 330 may be received on a supporting part 312 recessed into one surface of the frame 310. Poles 333 may protrude from a bottom surface of the base 330. Each of the poles 333 may protrude from a space between the adjacent pieces 320, or be formed in plurality to be spaced apart with preset intervals.

The frame 310 may include through holes 313 defining spaces for insertion of the poles 333 therein. The base 330 including the plurality of pieces 320 may be received on one surface of the supporting part 312 of the frame 310, and the poles 333 may be inserted into the through holes 313 so as to be partially exposed to another surface of the supporting part 312. A fixing member may be fixed to the exposed portion of each pole 333 through the through hole 313 and supported on the another surface of the supporting part 312, so as to restrict the pole 333 from being moved in an axial direction. Alternatively, an end portion of the pole 333 exposed through the through hole 313 may be welded so as to form a welded portion 334 for covering the another surface of the supporting part 312, thereby restricting the pole 333 from being moved in the axial direction.

An adhesive sheet 340 may be disposed on one surface of the supporting part 312 so as to allow the base 330 to be more firmly coupled onto the frame 310.

Referring to FIG. 7, a plurality of pieces 420 may be received on a frame 410. Adhesive sheets 430 may be disposed between the plurality of pieces 420 and the frame 410. The adhesive sheet 430 may be a thermally-adhesive tape, which is formed to have an adhesive property over a preset temperature. Here, the plurality of pieces 420 may be aligned in a provisionally adhered state on the frame 410 by the adhesive sheets 430.

Afterwards, a base 440, which is formed of synthetic resin through the insert-injection, may obscure lower portions of the plurality of pieces 420 and the frame 410. The adhesive sheet 430 may have an adhesive property by being melted due to heat, which increases during injection, and accordingly make the plurality of pieces 240 coupled onto the frame 410.

Figure 8:
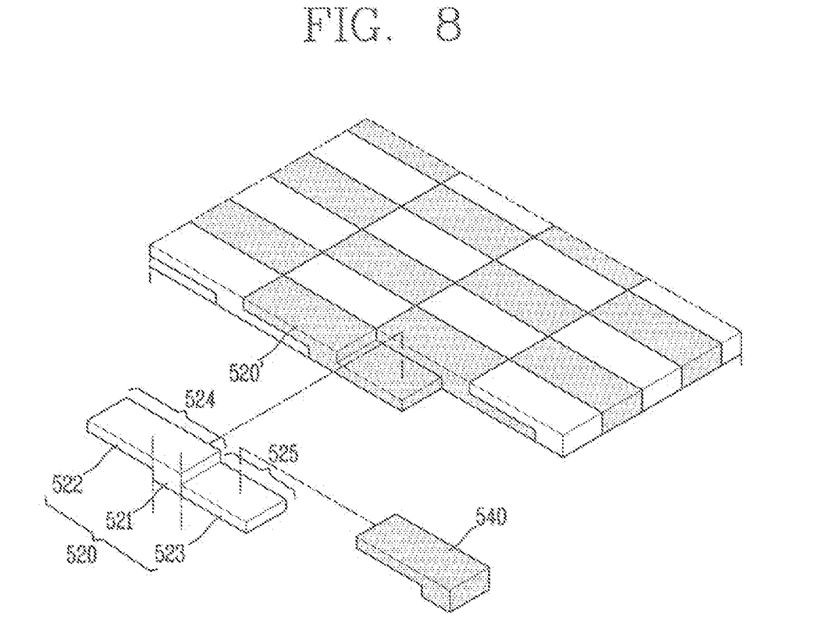
FIG. 8 is an overview showing a variation of the rear case structure of FIG. 3, which shows an overlapped structure of a plurality of pieces.
Figure 9:
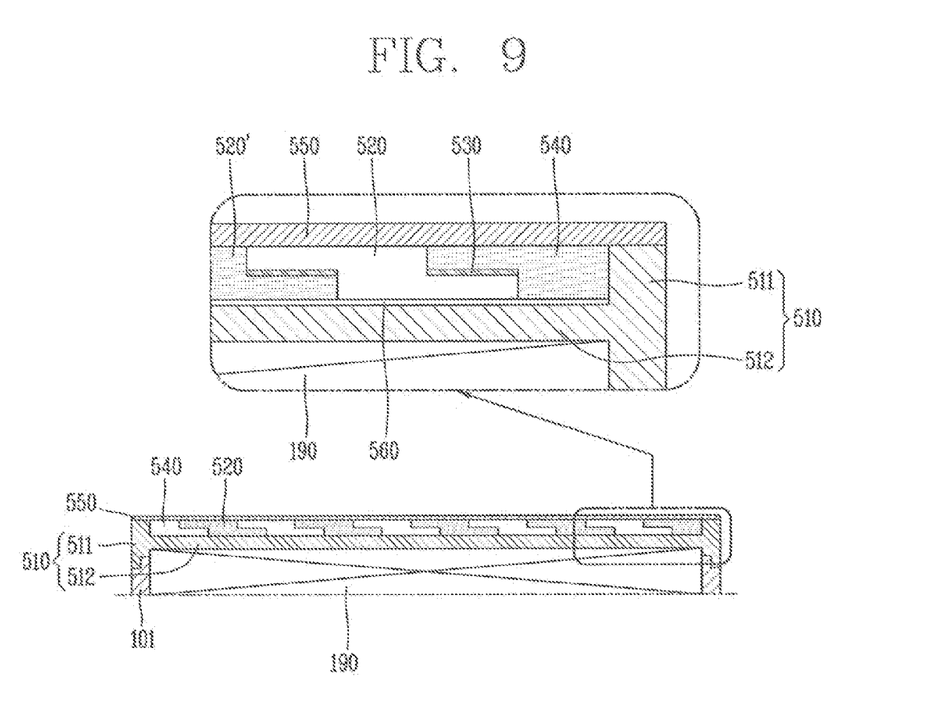
FIG. 9 is a side sectional view of a rear case shown in FIG. 8.

FIG. 8 shows a variation of a structure of the rear case 102 of FIG. 3, which is an overview showing an overlapped structure of a plurality of pieces 520, and FIG. 9 is a side sectional view showing the rear case 102 of FIG. 8.

As shown in FIGS. 8 and 9, the plurality of pieces 520 may be disposed to overlap one another. Each of the plurality of pieces 520 may include an exposed portion 524 exposed to the exterior, and an overlapped portion 525 obscured by the exposed portion 524 of an adjacent piece 520'. The exposed portion 524 and the overlapped portion 525 may be stepped with each other, and as shown, may have a shape of stair.

The plurality of pieces 520 may be implemented with various colors by mixing pigments with raw material powders of zirconia or ceramics. The exposed portion 524 of one of the plurality of pieces 520 may be flush with the exposed portion 524 of another one of the plurality of pieces 520. A cover layer 550 for covering the plurality of pieces 520 may be disposed on the flush surface for surface-processing.

Explaining a shape of each of the plurality of pieces 520 in more detail, each of the plurality of pieces 520 may include a body 521, a first extending portion 522 and a second extending portion 523.

The body 521 may include an upper surface and a lower surface. The first extending portion 522 may extend from the upper surface, and define an externally exposed portion together with the upper surface. The second extending portion 523 may extend from the lower surface and be overlapped by the first extending portion 522 of an adjacent piece 520'.

The plurality of pieces 520 may be coupled to one another by an adhesive disposed on each overlapped portion 525 or a separate coupling member. Alternatively, the plurality of pieces 520 in the overlapped state may be heat up at temperature close to a melting point so as to be bonded to one another at the overlapped portions 525. Here, a coupling layer 530 may be located between the first extending portion 522 of one of the plurality of pieces 520 and the second extending portion 523 of another one overlapped with the first extending portion 522. The coupling layer 530 may be formed by sintering the plurality of pieces 520 so as to couple the first extending portion 522 to the second extending portion 523.

The plurality of pieces 520 may be aligned in one direction in the overlapped state. The plurality of pieces 520 may be aligned in a direction perpendicular to the one direction, and be coupled to one another by the adhesive, the separate coupling member, the aforementioned sintering, and the like.

A finishing member 540 may be coupled to each piece 520 located at the edge. The finishing member 540 may be formed of the same material and have the same color as the plurality of pieces 520, except for a different shape thereof, so as to seem to be an integral body with the plurality of pieces 520 when viewing from the outside. The finishing member 540 may be disposed only at both sides or disposed along the edges depending on the shape of the plurality of pieces 520.

The plurality of pieces 520 can be coupled to the frame 510 by an adhesive sheet 560 disposed on one surface of the supporting part 512, or firmly coupled onto the frame 510 by a separate coupling structure (for example, a hook structure).

Figure 10:
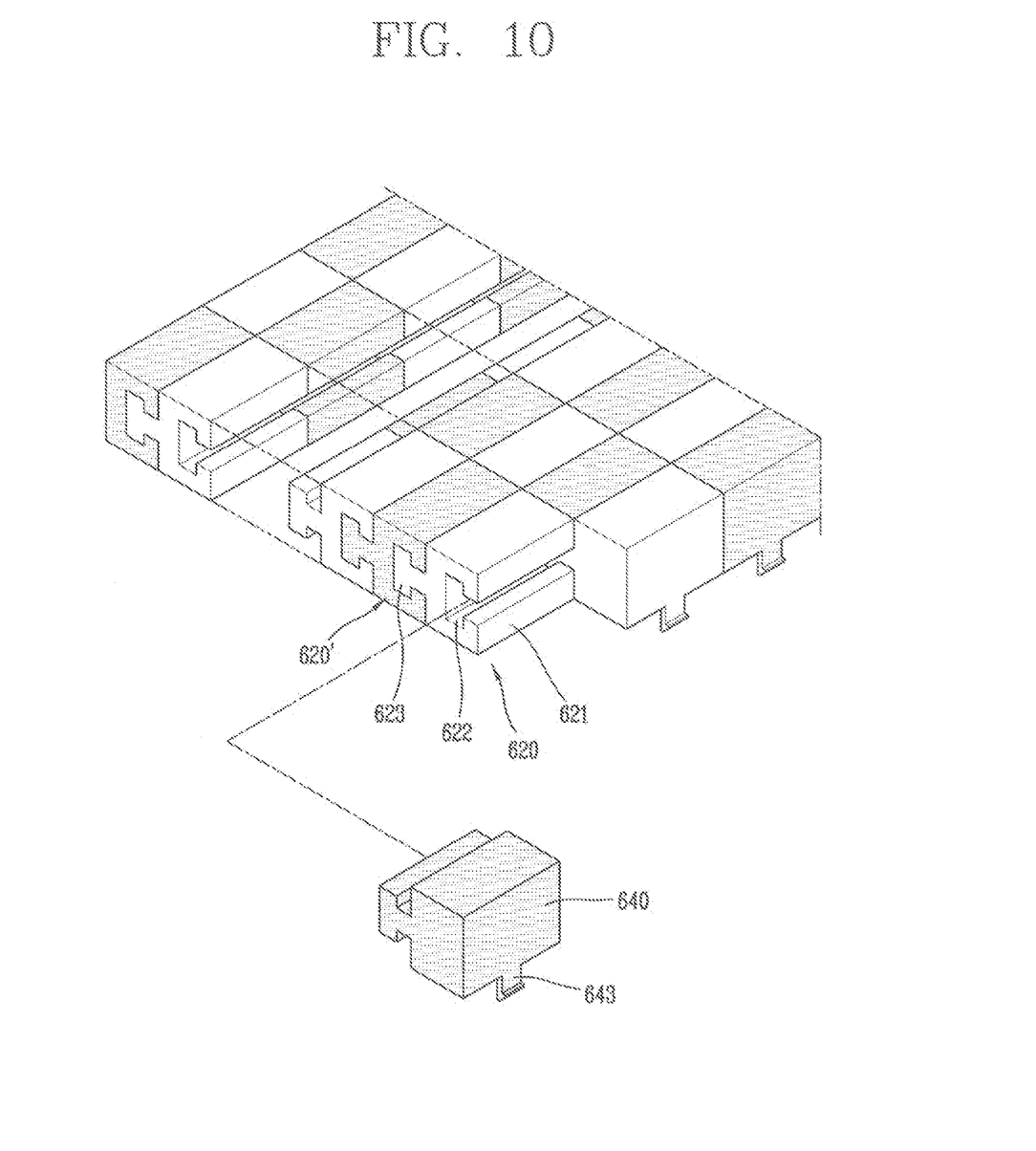
FIG. 10 is an overview showing a variation of the rear case structure of FIG. 3, which shows an overlapped structure of a plurality of pieces.
Figure 11:
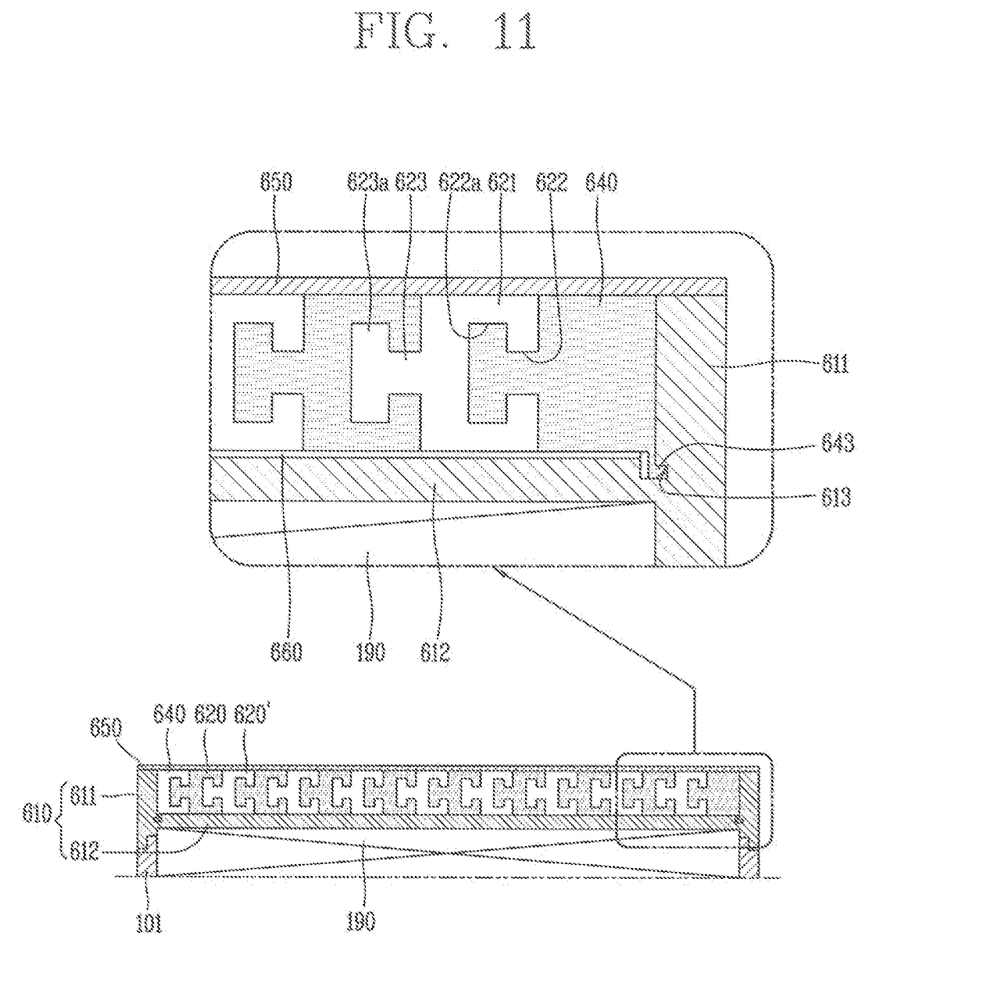
FIG. 11 is a side sectional view of the rear case shown in FIG. 10.

FIG. 10 shows a variation of a structure of the rear case 102 of FIG. 3, which is an overview showing an overlapped structure of the plurality of pieces 620, and FIG. 11 is a side sectional view of the rear case 102 of FIG. 10. This structure is the same as the structure described with reference to FIGS. 8 and 9 in the aspect that the plurality of pieces 620 are disposed to be overlapped by one another, but different therefrom in view of an overlapped/coupled structure. This difference will be described as follows.

As shown in FIGS. 10 and 11, each of the plurality of pieces 620 may include a base 621 and a protrusion 623. At least one surface of the base 621 may be exposed to the outside. The base 621 may include a receiving groove 622 in which the protrusion of an adjacent piece 620' is inserted. The protrusion 623 may protrude from the base 621 to be inserted into the receiving groove 622 of the adjacent piece 620' so as to overlap the base 621 of the adjacent piece 620'.

The drawings show that the receiving groove 622 and the protrusion 623 extend in one direction. With the structure, as each piece 620 is inserted and extends in one direction, the plurality of pieces 620 overlap one another repetitively and extend in a direction perpendicular to the one direction.

A stopping recess 622a may be formed at the receiving groove 622 for restricting separation of the inserted protrusion 623. A stopping jaw 623a may protrude from the protrusion 623 in an intersecting direction with the protruding direction of the protrusion 623. The stopping jaw 623a may be hooked at the stopping recess 622a to prevent the protrusion 623 from being separated in the protruding direction.

The plurality of pieces 620 can be coupled to one another by the structure of protrusion 623/receiving recess 622 and the stopping jaw 623a/stopping recess 622a. In addition, the plurality of pieces 620 may be coupled more firmly by the sintering and the like as aforementioned.

A finishing member 640 may be coupled to each piece 620 disposed at the edge. The finishing member 640 may be formed of the same material and have the same color as the plurality of pieces 620, except for a different shape thereof, so as to seem to be an integral body with the plurality of pieces 620 when viewing from the outside. The finishing member 640 may be disposed only at both sides or disposed along the edges depending on the shape of the plurality of pieces 620.

The finishing member 640 may be provided with a stopping hook 643, and the frame 610 may be provided with a stopping recess 613 in which the stopping hook 643 is coupled such that the finishing member 640 coupled to the plurality of pieces 620 can be fixed onto the frame 610. The stopping recess 613 may extend from an inner wall of the frame 610 in one direction. With the structure, a position where the stopping hook 643 is stopped may change along the one direction, so an affection of a tolerance can be minimized. The positions where the stopping hook 643 and the stopping recess 613 are formed may be swapped.

In accordance with the present disclosure, a plurality of pieces formed of zirconia or ceramic may be disposed in a repetitive manner to define one surface of a case, thereby implementing the case having a wider area and a thinner thickness.

The plurality of pieces may be connected in an overlapped state, so as to minimize deformation and damages, such as, torsion, breaking and the like, during molding/sintering process, as compared to a single product, thereby improving a yield of a product. Also, the connecting structure may allow for realization of a three-dimensional shape, which is difficult to be implemented in the mold itself.

In addition, the material itself can provide high quality and be processed into various patterns, so as to enhance the aesthetic effect of the case. High intensity of the material can also provide an effect of preventing scratches on the case.

The foregoing embodiments and advantages of the mobile terminal and the case fabricating method thereof are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising a case defining an appearance of the terminal, wherein the case comprises:
   a plurality of pieces formed of zirconia or ceramic, each piece having a preset shape; and
   a frame recessed into one surface of the case to receive the plurality of pieces, surfaces of the plurality of pieces fitted into the frame being exposed,
   wherein the plurality of pieces are aligned in a repetitive manner such that at least the exposed surfaces of the plurality of pieces define at least part of one external surface of the case,
   wherein each of the plurality of pieces comprises guide slits formed at a bottom surface of each of the plurality of pieces, and
   wherein the frame comprises guide ribs inserted into the corresponding guide slits.

2. The terminal of claim 1, wherein each of the plurality of pieces further comprises:
   a first portion exposed externally; and
   a second portion overlapped by a first portion of an adjacent piece.

3. The terminal of claim 2, wherein the first portion and the second portion are stepped with each other.

4. The terminal of claim 2, wherein the first portion formed at one of the plurality of pieces is flush with the first portion formed at another one of the plurality of pieces.

5. The terminal of claim 1, wherein each of the plurality of pieces further comprises:
   a body having a first surface and a second surface;
   a first extending portion extending from the first surface, at least one surface of the first extending portion being exposed externally; and
   a second extending portion extending from the second surface and overlapping with a first extending portion of an adjacent piece.

6. The terminal of claim 5, further comprising a coupling layer which is disposed between the first extending portion of one of the plurality of pieces and the second extending portion of another one of the plurality of pieces, wherein the coupling layer is formed by sintering the plurality of pieces to couple the first extending portion to the second extending portion.

7. The terminal of claim 1, wherein each of the plurality of pieces further comprises:
   a base having at least one surface exposed externally and a receiving groove; and
   a protrusion protruding from the base and inserted into a receiving groove of an adjacent piece.

8. The terminal of claim 7, wherein the receiving groove has a stopping recess to restrict separation of the protrusion of the adjacent piece.

9. The terminal of claim 7, further comprising a finishing piece coupled to each of the plurality of pieces that is located at an edge of the plurality of pieces.

10. The terminal of claim 9, wherein:
    the finishing piece comprises a stopping hook, and
    the frame comprises a stopping recess that is to be coupled with the stopping hook to fix the finishing piece coupled with the plurality of pieces onto the frame.

11. The terminal of claim 1, wherein the guide slits comprise a first slit extending in a first direction and a second slit extending in a second direction, the second direction intersecting with the first direction.

12. The terminal of claim 1, further comprising a cover layer covering the plurality of pieces.

13. A mobile terminal comprising a case defining an appearance of the terminal, wherein the case comprises:
    a plurality of pieces formed of zirconia or ceramic, each piece having a preset shape;
    a frame recessed into one surface of the case to receive the plurality of pieces, surfaces of the plurality of pieces fitted into the frame being exposed; and
    a base formed of synthetic resin, wherein the base is mounted onto the frame and lower portions of the plurality of pieces are obscured by the base,
    wherein the plurality of pieces are aligned in a repetitive manner such that at least the exposed surfaces of the plurality of pieces define at least part of one external surface of the case.

14. The terminal of claim 13, wherein the plurality of pieces are integrally coupled onto the base by an insert-injection.

15. The terminal of claim 13, wherein:
    the frame comprises through holes, and
    the base comprises poles protruding from one surface and inserted into the through holes.

16. The terminal of claim 15, wherein an end portion of each pole penetrating through the through hole is welded to form a welded portion.

17. A mobile terminal comprising a case defining an appearance of the terminal, wherein the case comprises:
    a plurality of pieces formed of zirconia or ceramic, each piece having a preset shape;
    a frame recessed into one surface of the case to receive the plurality of pieces, surfaces of the plurality of pieces fitted into the frame being exposed;
    adhesive sheets disposed between the plurality of pieces and the frame; and
    a base formed of synthetic resin, and covering lower portions of the plurality of pieces and the frame by an insert-injection,
    wherein the plurality of pieces are aligned in a repetitive manner such that at least the exposed surfaces of the plurality of pieces define at least part of one external surface of the case.

18. The terminal of claim 17, wherein the adhesive sheets have an adhesive property at a preset temperature range and allow coupling of the plurality of pieces onto the frame by heat generated upon the insert-injection.

19. A method for fabricating a case of a mobile terminal, the case defining an appearance of the mobile terminal, the method comprising:
    fabricating a plurality of pieces formed of zirconia or ceramic by an injection molding or a compression molding;
    aligning the plurality of pieces in a repetitive manner of inserting a protrusion of one of the plurality of pieces into a receiving groove of another one of the plurality of pieces;
    coupling a finishing piece to each of the plurality of pieces that is located at an edge of the plurality of pieces; and
    coupling the plurality of pieces coupled with the finishing piece onto a frame of the terminal such that the coupled plurality of pieces and finishing piece contact a first surface of the frame and the finishing piece also contacts a second surface of the frame.

20. A mobile terminal comprising a case defining an appearance of the terminal, wherein the case comprises:
    a plurality of pieces formed of zirconia or ceramic, each piece having a preset shape; and
    a frame recessed into one surface of the case to receive the plurality of pieces, surfaces of the plurality of pieces fitted into the frame being exposed,
    wherein the plurality of pieces are aligned in a repetitive manner such that at least the exposed surfaces of the plurality of pieces define at least part of one external surface of the case,
    wherein each of the plurality of pieces comprises:
        a body having a first surface and a second surface;
        a first extending portion extending from the first surface, at least one surface of the first extending portion being exposed externally; and
        a second extending portion extending from the second surface and overlapping with a first extending portion of an adjacent piece,
    wherein the case further comprises a coupling layer which is disposed between the first extending portion of one of the plurality of pieces and the second extending portion of another one of the plurality of pieces, and
    wherein the coupling layer is formed by sintering the plurality of pieces to couple the first extending portion to the second extending portion.

* * * * *